US012785652B2

(12) United States Patent
Suemori

(10) Patent No.: US 12,785,652 B2
(45) Date of Patent: Nov. 3, 2026

(54) ELECTRONIC DEVICE

(71) Applicant: Murata Manufacturing Co., Ltd., Nagaokakyo (JP)

(72) Inventor: Yoshiharu Suemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 933 days.

(21) Appl. No.: 18/108,075

(22) Filed: Feb. 10, 2023

(65) Prior Publication Data

US 2023/0188113 A1 Jun. 15, 2023

Related U.S. Application Data

(63) Continuation of application No. PCT/JP2021/032820, filed on Sep. 7, 2021.

(30) Foreign Application Priority Data

Sep. 18, 2020 (JP) ................................ 2020-157432

(51) Int. Cl.
*H03H 9/05* (2006.01)
*H03H 9/10* (2006.01)

(52) U.S. Cl.
CPC .......... *H03H 9/059* (2013.01); *H03H 9/1085* (2013.01)

(58) Field of Classification Search
CPC ............................ H03H 9/059; H03H 9/1085
USPC ......... 310/348, 313 R, 313 A, 313 B, 313 C, 310/313 D
See application file for complete search history.

(56) References Cited

U.S. PATENT DOCUMENTS

2011/0115339 A1* 5/2011 Makibuchi .............. H01L 23/10 310/344
2015/0280688 A1* 10/2015 Ortiz ...................... H10N 30/88 310/313 R
2017/0288627 A1* 10/2017 Takano ................ H03H 3/0072

FOREIGN PATENT DOCUMENTS

JP 2003168942 A 6/2003
JP 2004039945 A 2/2004
JP 2005086615 A 3/2005
JP 2005286917 A 10/2005
JP 2006120981 A 5/2006
JP 2008072617 A * 3/2008

OTHER PUBLICATIONS

International Search Report in PCT/JP2021/032820, mailed Nov. 22, 2021, 3 pages.
Written Opinion in PCT/JP2021/032820, mailed Nov. 22, 2021, 4 pages.

* cited by examiner

*Primary Examiner* — Derek J Rosenau
(74) *Attorney, Agent, or Firm* — Keating & Bennett, LLP

(57) ABSTRACT

A surface acoustic wave device includes a surface acoustic wave element including a functional element and a bump on one main surface, a substrate on which the surface acoustic wave element is mounted by using the bump as a joint, a frame positioned on the substrate to surround the surface acoustic wave element in a plan view of the surface acoustic wave element mounted on the substrate, and a sealing material that seals the surface acoustic wave element and seals a gap between the frame and the electronic component. The frame includes at least one recess adjacent to the surface acoustic wave element.

20 Claims, 5 Drawing Sheets

ELECTRONIC DEVICE

CROSS REFERENCE TO RELATED APPLICATIONS

This application claims the benefit of priority to Japanese Patent Application No. 2020-157432 filed on Sep. 18, 2020 and is a Continuation Application of PCT Application No. PCT/JP2021/032820 filed on Sep. 7, 2021. The entire contents of each application are hereby incorporated herein by reference.

BACKGROUND OF THE INVENTION

1. Field of the Invention

The present disclosure relates to an electronic device including an electronic component mounted on a substrate.

2. Description of the Related Art

Surface acoustic wave devices are widely used in the field of mobile communications, such as mobile phones. Surface acoustic wave devices convert electrical signals into surface acoustic waves (SAWs) to receive and transmit signals. Such a surface acoustic wave device includes a surface acoustic wave element mounted face-down on a substrate and has a frame made of a photosensitive resin or other materials and disposed on the substrate to surround the surface acoustic wave element. In the surface acoustic wave device, the surface acoustic wave element is integrally fixed by applying a sealing material, such as a sealing resin, from a surface of the surface acoustic wave element opposite to an element formation surface (Japanese Unexamined Patent Application Publication No. 2003-168942).

SUMMARY OF THE INVENTION

An electronic device, such as the surface acoustic wave device disclosed in Japanese Unexamined Patent Application Publication No. 2003-168942, has a frame that surrounds a face-down mounted surface acoustic wave element (an electronic component having a functional element on one main surface) so as to block intrusion of a sealing material into a gap between the surface acoustic wave element and a substrate. However, when the gap between the surface acoustic wave element and the substrate is cleaned with a cleaning solution to remove dirt (such as flux) remaining at the joint between the surface acoustic wave element and the substrate before the surface acoustic wave element is sealed with the sealing material, the frame hinders the cleaning solution from flowing into the gap between the surface acoustic wave element and the substrate and also hinders the cleaning solution that has flowed into the gap from flowing out.

Preferred embodiments of the present invention provide electronic devices in each of which a cleaning solution easily flows into a gap between an electronic component and a substrate and the cleaning solution that has flowed into the gap easily flows out.

An electronic device according to an aspect of a preferred embodiment of the present disclosure includes an electronic component including a functional element and a bump on one main surface, a substrate on which the electronic component is mounted using the bump as a joint, a frame positioned on the substrate to surround the electronic component in a plan view of the electronic component mounted on the substrate, and a sealing material that seals the electronic component and seals a gap between the frame and the electronic component, wherein the frame includes at least one recess adjacent to the electronic component.

Since the frame includes at least one recess adjacent to the electronic component according to an aspect of a preferred embodiment of the present disclosure, a cleaning solution easily flows into a gap between the electronic component and the substrate, and the cleaning solution that has flowed into the gap easily flows out.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic devices according to preferred embodiments of the present invention will be described below with reference to the drawings. In the following description, the same components are assigned with the same reference signs. The same components have the same names and the same functions. Therefore, detailed description of the same components is not repeated.

Preferred Embodiment

Figure 1:
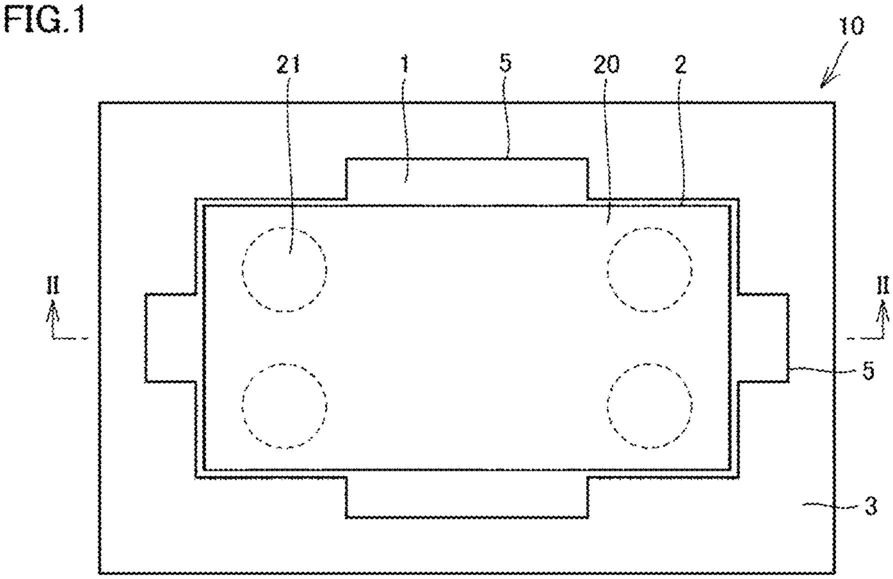
FIG. 1 is a plan view of an electronic device according to a preferred embodiment of the present invention.
Figure 2:
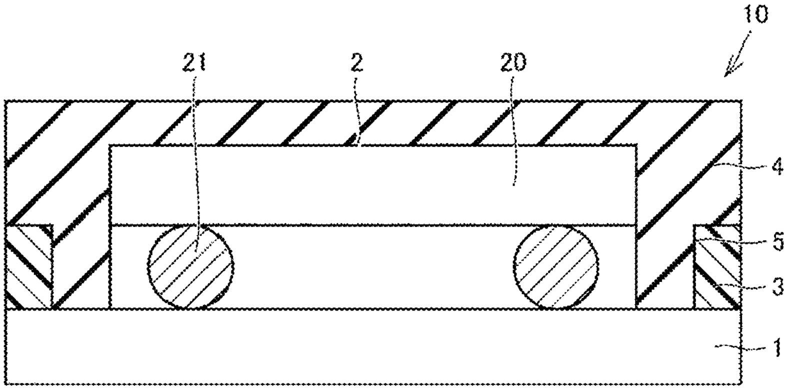
FIG. 2 is a cross-sectional view of an electronic device according to a preferred embodiment of the present invention.

FIG. 1 is a plan view of an electronic device according to a preferred embodiment. FIG. 2 is a cross-sectional view of the electronic device according to the present preferred embodiment. The cross-sectional view in FIG. 2 is a cross-sectional view taken along plane II-II in FIG. 1. The electronic device according to the present preferred embodiment is an example surface acoustic wave device in which a surface acoustic wave element defining and functioning as an electronic component is mounted on a substrate. Electronic devices according to preferred embodiments of the present disclosure are not necessarily surface acoustic wave devices, and may be any electronic device that, when including an electronic component including a functional element and a bump on one main surface and mounted on a substrate, includes a hollow portion between the electronic component and the substrate to ensure operation of the functional element. An electronic device according to a preferred embodiment of the present disclosure may be, for example, a thin film bulk acoustic wave device or a sensor device including a membrane structure.

A surface acoustic wave device 10 in FIG. 1 and FIG. 2 includes a substrate 1 made of a glass epoxy resin or other materials and a surface acoustic wave element 2 mounted face-down on the substrate 1. A frame 3 is positioned on the substrate 1 to surround the surface acoustic wave element 2 in the plan view (FIG. 1) of the mounted surface acoustic wave element 2. In the surface acoustic wave device 10, the surface acoustic wave element 2 mounted on the substrate 1 is sealed with a sealing material 4. In FIG. 1, the surface acoustic wave device 10 is viewed through the sealing material 4.

The substrate 1 includes an electrode (not shown) to electrically connect the substrate 1 to the surface acoustic wave element 2, and the electrode is connected to bumps 21 on one main surface of the surface acoustic wave device 10. The substrate 1 is not necessarily made of a glass epoxy resin, and may be, for example, a package substrate made of alumina or other materials, a silicon substrate, a piezoelectric substrate (lithium niobate (LN), lithium tantalate (LT)), a component-embedded substrate (a multilayer product including, for example, polyimide, an epoxy resin, and metal wiring).

The surface acoustic wave element 2 includes multiple comb electrodes (IDT electrodes) (not shown), which are functional elements, and multiple bumps 21 on one main surface of a piezoelectric substrate 20.

The piezoelectric substrate 20 is, for example, an LTCC substrate. The LTCC substrate is made of a piezoelectric single crystal material, such as lithium tantalate (LT), lithium niobate (LN), alumina ($Al_2O_3$), or sapphire, or a piezoelectric layered composite containing silicon (Si).

The IDT electrode is made of an electrode material, such as at least one single metal selected from aluminum, copper, silver, gold, titanium, tungsten, platinum, chromium, nickel, and molybdenum, or alloys including these metals as main components. In the surface acoustic wave element 2, the piezoelectric substrate 20 and the IDT electrodes define a surface acoustic wave resonator.

The bumps 21 are connection terminals to provide electrical connection between the surface acoustic wave element 2 and the substrate 1. The bumps 21 may be made of a material, such as gold, silver, or copper, although solder is described as an example.

The frame 3 is made of a photosensitive material, such as polyimide, and disposed on the substrate 1 in order to block intrusion of the sealing material 4 into a gap between the surface acoustic wave element 2 and the substrate 1. In other words, in the surface acoustic wave device 10, the frame 3 on the substrate 1 can keep a hollow portion between the surface acoustic wave element 2 and the substrate 1 even after the surface acoustic wave element 2 is sealed with the sealing material 4.

The gap between the surface acoustic wave element 2 and the substrate 1 is cleaned with a cleaning solution to remove dirt (e.g., flux for the bumps 21 made of solder (solder bumps)) remaining at the joint between the surface acoustic wave element 2 and the substrate 1 before the surface acoustic wave element 2 is sealed with the sealing material 4. However, blocking intrusion of the sealing material 4 into the gap between the surface acoustic wave element 2 and the substrate 1, the frame 3 hinders the cleaning solution from flowing into the gap between the surface acoustic wave element 2 and the substrate 1 and also hinders the cleaning solution that has flowed into the gap from flowing out.

In the surface acoustic wave device 10 according to the present preferred embodiment, the frame 3 has at least one recess 5 adjacent to the surface acoustic wave element 2. When the frame 3 prevents intrusion of the sealing material 4 into the gap between the surface acoustic wave element 2 and the substrate 1, and the cleaning solution flows in and out through the recess 5 of the frame 3, the cleaning solution easily flows into the gap between the surface acoustic wave element 2 and the substrate 1, and the cleaning solution that has flowed into the gap easily flows out.

In FIG. 1, the frame 3 includes a total four recesses 5, one recess 5 on each side. However, at least one recess 5 in the frame 3 is sufficient. When the frame 3 includes the recesses 5 adjacent to the surface acoustic wave element 2 so as to define a wide gap between the frame 3 and the surface acoustic wave element 2, the cleaning solution easily flows into the gap between the surface acoustic wave element 2 and the substrate 1, and the cleaning solution that has flowed into the gap easily flows out.

When the frame 3 includes multiple recesses 5, the cleaning solution easily flows into the gap between the surface acoustic wave element 2 and the substrate 1, and the cleaning solution that has flowed into the gap easily flows out. In particular, referring to FIG. 1, the multiple recesses 5 are each preferably provided on each of sides of the frame 3 that face each other with the surface acoustic wave element 2 interposed therebetween. For example, the recesses 5 are each provided on each of the short sides of the frame 3 so as to face each other. Alternatively, the recesses 5 are each provided on each of the long sides of the frame 3 so as to face each other.

Referring to FIG. 2, the recesses 5 reach the surface of the substrate 1. The sealing material 4 is thus disposed along the recesses 5 and in contact with the surface of the substrate 1. When the sealing material 4 intruding along the recesses 5 is in contact with the surface of the substrate 1, the sealing material 4 is strongly bonded to the substrate 1. In a plan view of the surface acoustic wave element 2 mounted on the substrate 1, the entire regions of the recesses 5 do not necessarily reach the surface of the substrate 1, and at least a portion of each recess 5 reaches the surface of the substrate 1.

The sealing material 4 is an epoxy resin used to mold common electronic components and includes a filler, such as silica or alumina. The sealing material 4 thus has higher viscosity than the cleaning solution. Preferably, the sealing material 4 includes about 30 wt % to about 85 wt % of a filler having an average size of about 0.4 μm to about 50 μm in the epoxy resin, for example. The epoxy resin and the curing agent are not limited however.

Figure 3A:
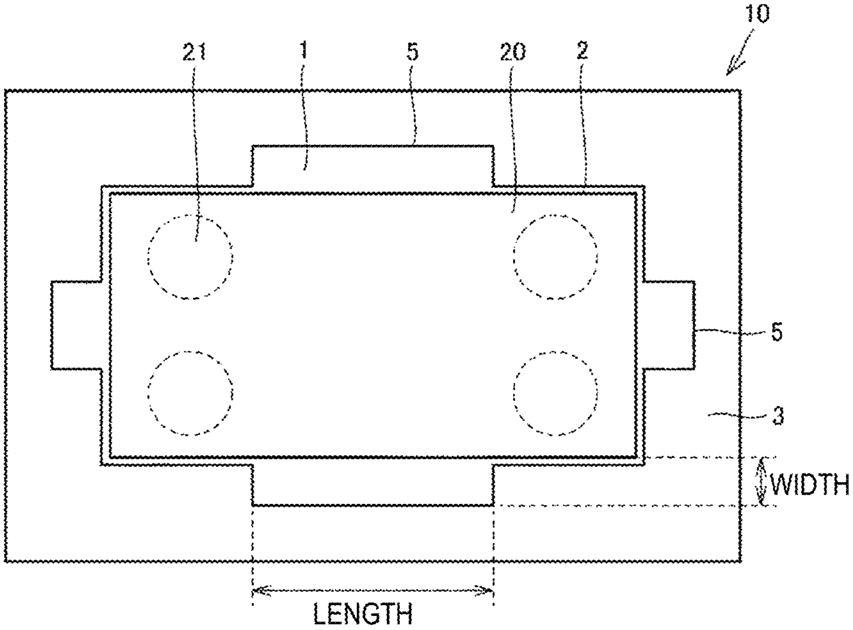
FIGS. 3A and 3B include views for describing the size of a recess in a frame of the electronic device according to a preferred embodiment of the present invention.
Figure 3B:
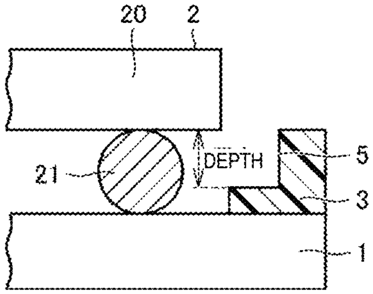

Since the recesses 5 are small relative to the frame 3, and the sealing material 4 has higher viscosity than the cleaning solution, as described above, the sealing material 4 is less likely to intrude into the gap between the surface acoustic wave element 2 and the substrate 1 even when the frame 3 has the recesses 5. However, further limitation of the sizes of the recesses 5 makes it more difficult for the sealing material 4 to intrude into the gap between the surface acoustic wave element 2 and the substrate 1. The size of a recess 5 will be described. FIGS. 3A and 3B include views for describing the size of a recess 5 in the frame 3 of the electronic device according to the present preferred embodiment. FIG. 3A is a plan view of the surface acoustic wave element 2 mounted on the substrate 1, and the surface acoustic wave element 2 is viewed through the sealing material 4. FIG. 3B is a cross-sectional view of the frame 3 including the recesses 5.

Referring to FIG. 3A, the length of one recess 5 is a length in a direction along the corresponding side of the frame 3, and the width of the recess 5 is a length perpendicular or substantially perpendicular to the direction along the corresponding side of the frame 3 and extending to an edge of the surface acoustic wave element 2. Referring to FIG. 3B, the depth of the recess 5 is a length from the deepest portion of the recess 5 to one main surface of the surface acoustic wave element 2 in a direction perpendicular or substantially perpendicular to the surface of the substrate 1. When the recess 5 reaches the surface of the substrate 1, the deepest portion of the recess 5 corresponds to the surface of the substrate 1.

When the size of the recess 5 is defined as described above, at least one of the length, the width, or the depth of the recess 5 in the frame 3 is preferably less than about 30 μm, for example. When at least one of the length, the width, or the depth of the recess 5 is less than about 30 μm, the sealing material 4 having higher viscosity than the cleaning solution is less likely to pass through the recess 5 and less likely to flow into the gap between the surface acoustic wave element 2 and the substrate 1.

The width of the recess 5 is not the length of the recess 5 in the frame 3, but the length to an edge of the surface acoustic wave element 2. When the width of the recess 5 is about 30 μm, and the gap between the frame 3 and the surface acoustic wave element 2 is about 10 μm, the length of the recess 5 in the frame 3 is only about 20 μm, for example.

The depth of the recess 5 is a length from the deepest portion of the recess 5 to one main surface of the surface acoustic wave element 2, not a length from the deepest portion of the recess 5 to the top surface of the frame 3. In other words, the frame 3 is not necessarily higher than the height to one main surface of the surface acoustic wave element 2, and may be lower than one main surface of the surface acoustic wave element 2.

The width of the recess 5 is not determined only by the size of the recess 5 in the frame 3 and varies depending on the gap between the frame 3 and the surface acoustic wave element 2. The gap between the frame 3 and the surface acoustic wave element 2 depends on the accuracy of how the surface acoustic wave element 2 is mounted on the substrate 1. Even if the surface acoustic wave element 2 can be mounted on the substrate 1 by self-alignment using the bumps 21 made of solder (solder bumps), variations in mounting generate an error in the width of the recess 5.

The depth of the recess 5 is not determined only by the size of the recess 5 in the frame 3 and varies depending on the height to one main surface of the surface acoustic wave element 2. The height to one main surface of the surface acoustic wave element 2 depends on the accuracy of how the surface acoustic wave element 2 is mounted on the substrate 1. Even if the bumps 21 have the same diameter, variations in mounting the surface acoustic wave element 2 on the substrate 1 generate an error in the depth of the recess 5.

The length of the recess 5 is determined only by the size of the recess 5 in the frame 3. Therefore, the length of the recess 5 is less subject to variations in mounting, and an error in the length of the recess 5 is unlikely to occur. The length of the recess 5 in the frame 3 is preferably less than about 30 μm, for example. When the length of the recess 5 is less than about 30 μm, a dimension of the recess 5 of less than about 30 μm among dimensions of the recess 5 is less subject to variations in mounting the surface acoustic wave element 2 on the substrate 1.

Figure 4:
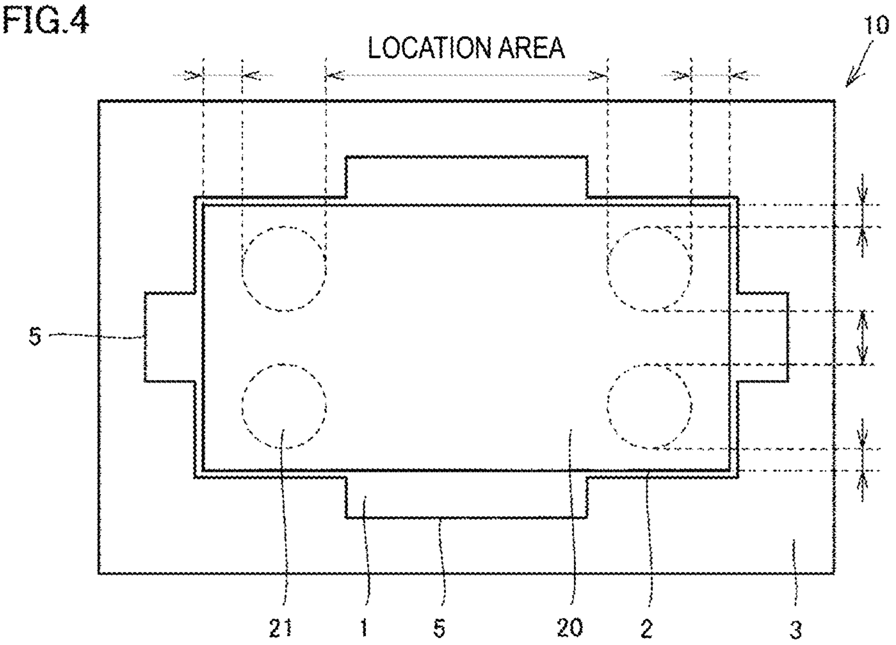
FIG. 4 is a view for illustrating the location areas of recesses in a frame of an electronic device according to a preferred embodiment of the present invention.

Next, preferable location areas of the recesses 5 in the frame 3 in forming the recesses 5 in the frame 3 will be described. FIG. 4 is a view for describing the location areas of the recesses 5 in the frame 3 of the electronic device according to the present preferred embodiment. When the recesses 5 are in the frame 3, the recesses 5 are preferably located away from the bumps 21. Therefore, the location areas are areas in the frame 3 other than portions facing portions where the bumps 21 are located. In other words, referring to FIG. 4, lines perpendicular to the frame 3 are drawn from both ends (corresponding to the diameters of the bumps 21) of portions where the bumps 21 are located, and areas other than the areas between the perpendicular lines are defined as location areas.

Since the recesses 5 are provided in the location areas in the frame 3, the effect of the bumps 21 can be avoided when the cleaning solution flows into or out of the gap between the surface acoustic wave element 2 and the substrate 1. FIG. 4 does not illustrate all location areas in the frame 3 but illustrates location areas on one long side of the frame 3 and one short side of the frame 3.

Figure 5A:
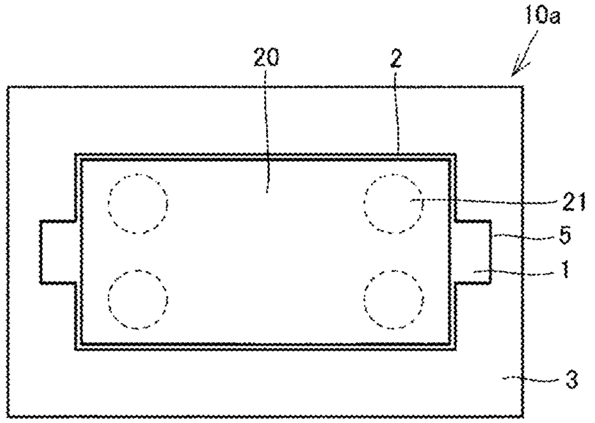
FIGS. 5A to 5C include views for describing arrangement examples of recesses in a frame of an electronic device according to a preferred embodiment of the present invention.
Figure 5B:
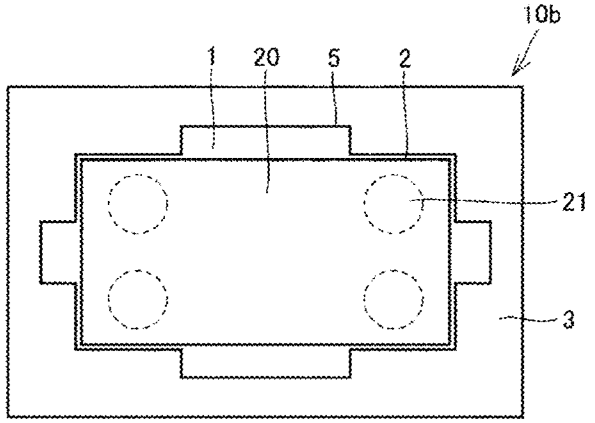
Figure 5C:
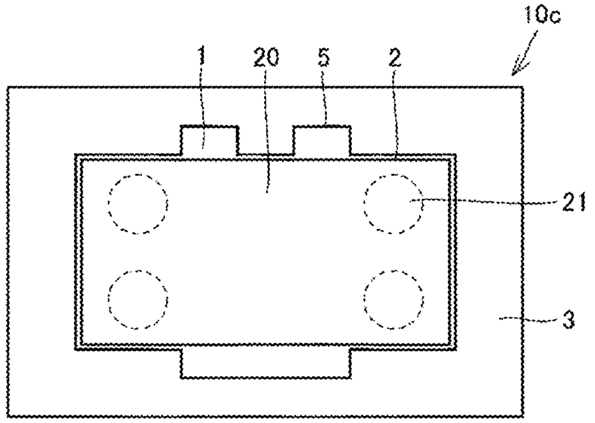

The recesses 5 can be provided in the frame 3 as long as they are in the location areas. Hereinafter, arrangement examples of the recesses 5 in the frame 3 will be described. FIGS. 5A to 5C include views for describing the arrangement examples of the recesses in the frame of the electronic device according to the present preferred embodiment. The views in FIGS. 5A to 5C are all plan views of the surface acoustic wave element 2 mounted on the substrate 1, and the surface acoustic wave element 2 is viewed through the sealing material 4.

In a surface acoustic wave device 10*a* in FIG. 5A, the frame 3 has one recess 5 on each short side and has no recess 5 on the long sides. In a surface acoustic wave device 10*b* in FIG. 5B, the frame 3 has one recess 5 on each short side and has one recess 5 on each long side. In a surface acoustic wave device 10*c* in FIG. 5C, the frame 3 has two recesses 5 on one long side and one recess 5 on the other long side and has no recess 5 on the short sides. The arrangement examples of the recesses 5 in FIGS. 5A to 5C are illustrative, and the recesses 5 may be arranged differently.

Figure 6:
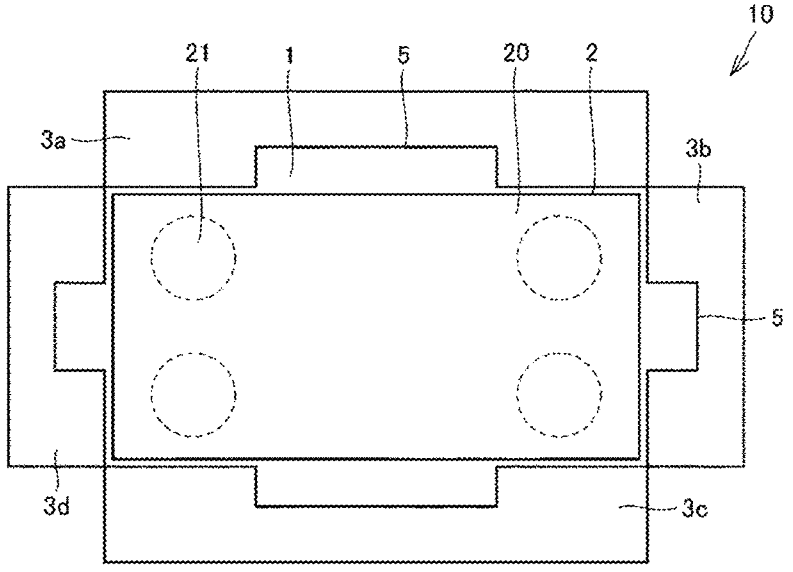
FIG. 6 is a view of a modified frame including multiple parts.

The frame 3 described above is illustrated as an integrally formed frame around the surface acoustic wave element 2, but is not limited to an integrally formed frame. FIG. 6 is a view of a modified frame including multiple parts. The frame in FIG. 6 includes four parts in a plan view of the frame 3, and frames 3*a* to 3*d* surround the periphery of the surface acoustic wave element 2. The frame in FIG. 6 is illustrative and may include two parts, or five or more parts.

Figure 7:
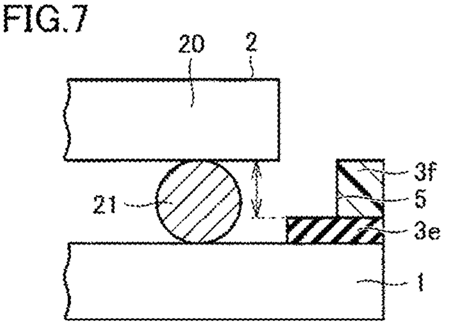
FIG. 7 is a view of a modified frame including multiple layers.

The frame 3 described above is illustrated as a frame including one layer made of a photosensitive material, but is not limited to a frame having one layer. FIG. 7 is a view of a modified frame including multiple layers. The frame in FIG. 7 includes two layers, that is, a frame 3*e* including metal wiring and a frame 3*f* made of a photosensitive material. The frame in FIG. 7 is illustrative, and the frame may include three or more layers.

As described above, the electronic device (surface acoustic wave device 10) according to the present preferred embodiment includes the electronic component (surface acoustic wave element 2) that includes functional elements and bumps 21 on one main surface, the substrate 1 on which the electronic component including the bumps 21 is mounted by using the bumps 21 as joints, the frame 3 that is disposed on the substrate 1 to surround the electronic component in a plan view of the electronic component mounted on the substrate 1, and the sealing material 4 that seals the electronic component and seals a gap between the frame and the electronic component. The frame 3 includes at least one recess 5 adjacent to the electronic component.

In the electronic device according to the present preferred embodiment, the cleaning solution thus easily flows into a gap between the electronic component and the substrate 1 through the recess 5, and the cleaning solution that has flowed into the gap easily flows out through the recess 5. The frame 3 can prevent misalignment of the electronic component with respect to the substrate 1 when the electronic component is mounted on the substrate 1. The recess 5 in the frame 3 reduces continuity of the frame and can thus reduce or prevent deformation (e.g., warpage) of the frame.

Preferably, at least a portion of the recess 5 reaches the surface of the substrate 1, and the sealing material 4 is positioned along the recess 5 and in contact with the surface of the substrate 1. This configuration increases the bonding strength between the sealing material 4 and the substrate 1.

The frame 3 preferably includes multiple recesses 5. In particular, the multiple recesses 5 are each preferably provided on each of sides of the frame 3 that face each other with the electronic component interposed therebetween. With this configuration, the cleaning solution can more easily flow into a gap between the electronic component and the substrate 1, and the cleaning solution that has flowed into the gap can more easily flow out.

Areas in the frame 3 other than portions facing the portions where the bumps 21 are located are defined as location areas where the recesses 5 are located. With this configuration, the recesses 5 can be positioned so as not to be affected by the bumps 21.

When the length of one recess 5 is a length in a direction along the corresponding side of the frame 3, the width of the recess 5 is a length perpendicular or substantially perpendicular to the direction along the corresponding side of the frame 3 and extending to an edge of the electronic component, and the depth of the recess 5 is a length from the deepest portion to one main surface of the electronic component in a direction perpendicular or substantially perpendicular to the surface of the substrate 1, at least one of the length, the width, or the depth of the recess 5 is preferably less than about 30 μm, for example. This configuration can further prevent intrusion of the sealing material 4 into a gap between the electronic component and the substrate 1.

When the length of one recess 5 is a length in a direction along the corresponding side of the frame 3, the width of the recess 5 is a length perpendicular or substantially perpendicular to the direction along the corresponding side of the frame 3 and extending to an edge of the electronic component, and the depth of the recess 5 is a length from the deepest portion of the recess 5 to one main surface of the electronic component in a direction perpendicular or substantially perpendicular to the surface of the substrate 1, the length of the recess 5 is preferably less than about 30 μm, for example. Thus, a dimension of the recess 5 of less than about 30 μm among dimensions of the recess 5 is less subject to variations in mounting the electronic component on the substrate 1.

The frame 3 preferably includes multiple parts in a plan view of the frame 3. When the frame 3 includes multiple parts, the frame has low continuity and is less likely to deform (e.g., warp).

The frame 3 preferably includes multiple layers. This configuration increases the degree of freedom in producing the frame 3.

The bumps 21 are preferably solder bumps. The use of solder bumps facilitates face-down mounting of the electronic component on the substrate 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:

an electronic component including a functional element and a bump on one main surface;

a substrate on which the electronic component is mounted using the bump as a joint;

a frame positioned on the substrate to surround the electronic component in a plan view of the electronic component mounted on the substrate; and a sealing material that seals the electronic component and seals a gap between the frame and the electronic component; wherein the frame includes at least one recess adjacent to the electronic component; and at least a portion of the frame does not overlap with the electronic component in the plan view of the electronic component mounted on the substrate.

2. The electronic device according to claim 1, wherein at least part of the recess extends to a surface of the substrate, and the sealing material is positioned along the recess and in contact with the surface of the substrate.

3. The electronic device according to claim 1, wherein the frame includes a plurality of the recesses.

4. The electronic device according to claim 3, wherein the recesses are each provided on each of sides of the frame facing each other with the electronic component interposed therebetween.

5. The electronic device according to claim 1, wherein an area in the frame other than a portion facing a portion where the bump is located is a location area where the recess is located.

6. The electronic device according to claim 1, wherein when a length of the recess is a length in a direction along a side of the frame, a width of the recess is a length perpendicular or substantially perpendicular to the direction along the side of the frame and extending to an edge of the electronic component, and a depth of the recess is a length from a deepest portion to the one main surface of the electronic component in a direction perpendicular or substantially perpendicular to the surface of the substrate;

at least one of the length, the width, or the depth of the recess is less than about 30 μm.

7. The electronic device according to claim 1, wherein when a length of the recess is a length in a direction along a side of the frame, a width of the recess is a length perpendicular or substantially perpendicular to the direction along the side of the frame and extending to an edge of the electronic component, and a depth of the recess is a length from a deepest portion of the recess to the one main surface of the electronic component in a direction perpendicular or substantially perpendicular to the surface of the substrate;

the length of the recess is less than about 30 μm.

8. The electronic device according to claim 1, wherein the frame includes a plurality of parts in a plan view of the frame.

9. The electronic device according to claim 1, wherein the frame includes a plurality of layers.

10. The electronic device according to claim 1, wherein the bump is a solder bump.

11. The electronic device according to claim 1, wherein the electronic component is a surface acoustic wave element.

12. The electronic device according to claim 1, wherein the electronic component is a surface acoustic wave resonator.

13. The electronic device according to claim 1, wherein a hollow portion is provided between the electronic component and the substrate.

14. The electronic device according to claim 1, wherein the electronic device is a thin film bulk acoustic wave device or a sensor device.

15. The electronic device according to claim 1, wherein the substrate includes a glass epoxy resin, alumina, silicon, a piezoelectric material, polyimide, an epoxy resin, or a metal wiring.

16. The electronic device according to claim 3, wherein the sealing material is positioned along the plurality of recesses such that the sealing material intrudes along the plurality of recesses in contact with the substrate.

17. The electronic device according to claim 1, wherein the sealing material includes an epoxy resin and one of silica or alumina.

18. The electronic device according to claim 17, wherein the sealing material includes about 30 wt % to about 85 wt % of the filler having an average size of about 0.4 μm to about 50 μm in the epoxy resin.

19. The electronic device according to claim 3, wherein at least one of the plurality of recesses is located on a shorter side of the frame and at least one of the plurality of recesses is located on a longer side of the frame.

20. The electronic device according to claim 3, wherein none of the plurality of recesses is located on a shorter side of the frame and at least one of the plurality of recesses is located on a longer side of the frame, or at least one of the plurality of recesses is located on a shorter side of the frame and none of the plurality of recesses is located on a longer side of the frame.

* * * * *